(12) United States Patent
Gollier (10) Patent No.: US 7,898,750 B2
(45) Date of Patent: Mar. 1, 2011

(54) FOLDED OPTICAL SYSTEM AND A LENS FOR USE IN THE OPTICAL SYSTEM

(75) Inventor: Jacques Gollier, Painted Post, NY (US)

(73) Assignee: Corning Incorporated, Corning, NY (US)

( * ) Notice: Subject to any disclaimer, the term of this patent is extended or adjusted under 35 U.S.C. 154(b) by 14 days.

(21) Appl. No.: 12/393,299

(22) Filed: Feb. 26, 2009

(65) Prior Publication Data

US 2010/0214652 A1 Aug. 26, 2010

(51) Int. Cl.
G02B 5/08 (2006.01)
G02B 17/00 (2006.01)
G02B 13/18 (2006.01)

(52) U.S. Cl. .................. 359/726; 359/732; 359/708; 359/718; 359/719

(58) Field of Classification Search ......... 359/641–642, 359/433, 726, 732, 351, 227, 720, 196.1, 359/718, 708; 372/93
See application file for complete search history.

(56) References Cited

U.S. PATENT DOCUMENTS

| | | | | |
|---|---|---|---|---|
| 4,832,451 | A * | 5/1989 | Trescott | 359/641 |
| 6,807,018 | B2 * | 10/2004 | Maruyama et al. | 359/719 |
| 7,457,031 | B1 | 11/2008 | Gollier | 359/326 |
| 2003/0189772 | A1 | 10/2003 | Maruyama et al. | 359/823 |
| 2004/0131093 | A1 | 7/2004 | Waarts et al. | 372/22 |
| 2008/0279057 | A1 | 11/2008 | Tashiro et al. | 369/44.23 |
| 2009/0001169 | A1 | 1/2009 | Vinogradov | 235/462.41 |
| 2009/0022188 | A1 | 1/2009 | Almoric et al. | 372/22 |

FOREIGN PATENT DOCUMENTS

| | | |
|---|---|---|
| EP | 1601070 | 11/2005 |
| EP | 1959281 | 7/2008 |
| EP | 2133718 | 12/2009 |
| WO | 2009/058215 | 5/2009 |
| WO | 2009/097109 | 8/2009 |
| WO | 2009/134407 | 11/2009 |
| WO | 2009/151559 | 12/2009 |

OTHER PUBLICATIONS

"Decenter and Tilt Tolerances: Centering of Lenses with Spherical Surfaces"; from Handbook of Optical Systems; Edited by Herbert Gross; vol. 3 2007.
"Three- and Four-Mirror Laser Cavities: Three-Mirror Lasers"; Library of Congress 1995; John Wiley & Sons, Inc.

* cited by examiner

Primary Examiner—Ricky L Mack
Assistant Examiner—Zachary Wilkes
(74) Attorney, Agent, or Firm—Svetlana Z Short (57) ABSTRACT

An optical system having an optical axis OA and comprising: a light source; a reflector; a lens component situated therebetween; and a receiver. The light source and the receiver are separated, situated substantially symmetrically and decentered with respect to the OA. The lens component collimates the light beam from the light source. The reflector intercepts the collimated beam and to reflects it to the receiver through the lens, the collimated beam being at an angle to the optical axis. The lens component is structured to provide on the receiver an image of the light source characterized by (i) 0.05<astigmatism<0.1 waves RMS, when the lens component is not misaligned with respect to the average emission angle of the light source; and (ii) astigmatism<0.05 RMS when the lens component is tilted by of 2 to 5 degrees with respect to the average emission angle of the light source.

17 Claims, 6 Drawing Sheets

FOLDED OPTICAL SYSTEM AND A LENS FOR USE IN THE OPTICAL SYSTEM

BACKGROUND OF THE INVENTION

1. Field of the Invention

The present invention relates generally to optical systems and more particularly to folded laser system and lenses for use in such systems.

2. Technical Background

Figure 1A:
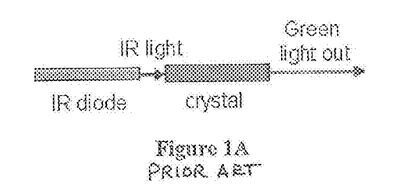
FIG. 1A illustrates a prior art optical system.

Generation of green laser light can be achieved by non-linear frequency doubling of infrared light. Typically, as illustrated in laser system of FIG. 1A, a light beam 2 from an infrared diode laser (3) is directed into a non-linear optical crystal 4, such as periodically-poled lithium niobate (PPLN) where it is converted into green light 5. In order to provide the light from the infrared diode laser to the non-linear optical crystal a lens 6 is placed between the infrared diode laser (3) and the non-linear optical crystal 4. The lens 6 intercepts the infrared light from the diode laser 3, and couples this light into the non-linear optical crystal 4.

However, because the laser systems utilize small optical waveguides that are used to confine the light in both the diode laser and the non-linear optical crystal, alignment tolerances for the components (lens, the non-linear crystal and the diode laser) are on the order of a few tenths of microns or less. This presents a challenge both for initial assembly of the laser system and for maintaining component alignment over the laser's lifetime.

SUMMARY OF THE INVENTION

One aspect of the invention is an optical system having an optical axis, the optical system comprising: (I) a light source; (II) a reflector; (III) a lens component situated between the light source and the reflector; (IV) a receiver, wherein the light source and the receiver are situated substantially symmetrically and are decentered with respect to the optical axis, and are separated by a distance d from one another; wherein: (a) the lens component is positioned to provide a collimated beam when intercepting light from the light source, and (b) the reflector is situated to intercept the collimated beam and to reflect the collimated beam to the receiver through the lens; and such that the collimated beam is at an angle $\Theta'$ to the optical axis; and (c) the lens component is structured to provide on the receiver an image of the light source, the image characterized by (i) astigmatism of more than 0.05 waves RMS, and less than 0.1 waves RMS, when the lens component is not misaligned with respect to the average emission angle of the light source; and (ii) astigmatism of less than 0.05 for tilt angles of 2 to 5 degrees, when the lens component is tilted by of 2 to 5 degrees with respect to the average emission angle of the light source.

According to some embodiments the optical system is a green laser, the light source is an infra red (IR) diode laser, and the receiver is a non-linear optical crystal, for example SHG (second harmonic generator) for converting IR light to green light.

We have also discovered that the fine structure on the input facet (i.e., the front facet) of the waveguide portion of the non-linear optical crystal can scatter light back toward the diode laser and may cause the diode laser wavelength to undergo mode hops, which can greatly affect IR-to-green conversion efficiency and hence introduce image artifacts.

In some embodiments of the present invention, the optical path length OPL from the output facet of the diode laser to the input facet of the non-linear optical crystal is approximately (within ±10%) equal to n times the optical path length inside the diode laser itself, where n is an integer. Preferably n=1.

Some advantages provided by the exemplary green laser embodiments of the optical system of the present invention is relatively loose angular alignment tolerances for the reflector and the lens component (e.g., on the order of 5 degrees) and low sensitivity to parasitic reflections occurring on the input facet of the non-linear crystal.

In another aspect, the present invention includes a lens situated on an optical axis, the lens comprising: (I) a front surface; (II) a rear surface separated from said front surface by a distance T; the lens being structured to: (A) provide, when imaging an off-axis source displaced by a distance d' from the optical axis, a collimated beam exiting said rear surface, such that the collimated beam is at an angle $\Theta'$ to the optical axis; and (B) to intercept said collimated beam, when coupled with a reflective surface, and to provide an image of the off-axis source, the image having:

(a) astigmatism of more than 0.05 waves RMS when the lens component is not misaligned with respect to the optical axis; and (b) astigmatism of less than 0.05 waves RMS for tilt angles of 2 to 6 degrees when the lens component is tilted by 2 to 5 degrees with respect to either (i) the optical axis, or (ii) the average emission angle of the source.

Additional features and advantages of the invention will be set forth in the detailed description which follows, and in part will be readily apparent to those skilled in the art from that description or recognized by practicing the invention as described herein, including the detailed description which follows, the claims, as well as the appended drawings.

It is to be understood that both the foregoing general description and the following detailed description present embodiments of the invention, and are intended to provide an overview or framework for understanding the nature and character of the invention as it is claimed. The accompanying drawings are included to provide a further understanding of the invention, and are incorporated into and constitute a part of this specification. The drawings illustrate various embodiments of the invention, and together with the description serve to explain the principles and operations of the invention.

DETAILED DESCRIPTION OF THE PREFERRED EMBODIMENTS

Reference will now be made in detail to the present preferred embodiment(s) of the invention, examples of which are illustrated in the accompanying drawings. Whenever possible, the same reference numerals will be used throughout the drawings to refer to the same or like parts. One exemplary embodiment of the optical system of the present invention is shown in FIG. 1B, and is designated generally throughout by the reference numeral 10.

The optical system 10 in this exemplary embodiment is a frequency doubled green laser that has a folded configuration. In the optical system 10 light is emitted from a light source 20 in this example, an infrared (IR) diode laser 20') in the form of the divergent light beam 22, and is captured and collimated by a single lens component 30. In this embodiment, the divergent light beam 22 provided by the light source 20 is characterized by the emission divergence half angle $\Theta$ at $1/e^2$, for example 20° in one direction and 7° in the other (perpendicular) direction. The collimated (infrared) beam 40 propagates towards reflector 50 at an angle $\Theta'$ and is then reflected from the reflector 50 back toward lens component 30. Preferably, according to some embodiments, 0.05 Rad$\leq\Theta'\leq$0.2 Rad, and more preferably 0.09 Rad$\leq\Theta'\leq$0.17 Rad. The reflector 50 may be, for example, a planar mirror. The reflected beam propagates through the lens component 30 towards the image plane 60, where it is focused on the receiver 70, which in this embodiment is the input facet of the waveguide portion of a non-linear optical crystal 70', for example a second harmonic generator (SHG) crystal. In this embodiment the non-linear optical crystal 70' receives the IR light provided to it by the lens component 30 and converts it to green light 5. Adjustment either of the position of the lens component 30, or of the angle of the reflector 50, can be utilized to move the focused spot at the entrance facet of the non-linear optical crystal 70'.

In this example, both the light source 20 and the receiver (non-linear optical crystal 70') are decentered with respect to the optical axis OA (optical axis of the lens component 30) and are situated symmetrically or approximately symmetrically (within ±100 μm) with respect to the optical axis. More specifically, the output facet of the waveguide of the infrared diode 20' and the input facet of the waveguide of the non-linear optical crystal 70' are separated by a small distance d compared to the focal length f of the lens 30 (i.e., d<<f), in order to minimize aberrations of the light beam at the receiver 70 (at the image plane). Preferably, the focal length f of the lens 30 is 1 to 5 mm (1 mm$\leq$f$\leq$5 mm). Preferably the separation d between the light source 20 and the non-linear optical crystal 70' is 30 μm$\leq$d$\leq$1500 μm, more preferably 50 μm$\leq$d$\leq$750 μm, more preferably 100 μm$\leq$d$\leq$600 μm, even more preferably 150 μm$\leq$d$\leq$500 μm and most preferably 300 μm$\leq$d$\leq$500 μm. Thus, in this embodiment, the light source 20 (diode laser 20') and the receiver 70 (non-linear optical crystal optical crystal 70') are decentered along the Y axis, with respect to the optical axis, by a distance d'$\approx$d/2, for example by a distance d'=d/2±100 μm. Preferably the decenter distance d' equals d/2 or is within 50 μm of d/2 (i.e., d'=d/2±50 μm).

Figure 1B:
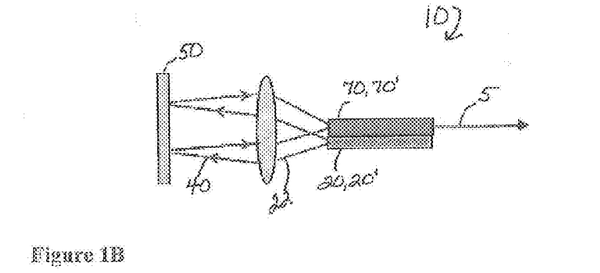
FIG. 1B illustrates schematically a folded optical system according to one embodiment of the present invention.

The folded laser design configuration shown in FIG. 1B has the advantage of reducing the overall length of the laser cavity (and hence reduces the package size of the laser), because the optical path is folded upon itself. The folded laser configuration also advantageously minimizes the effect of anti-symmetric optical aberrations produced by the lens component 30 because the same lens component 30 is used twice—once to collimate the beam and once to refocus the light on the input facet of the non-linear optical crystal 70'. Given stable and accurate attachment techniques, the optical system 10 may be completely passive (i.e., it may include no moving components). (Such design is illustrated schematically in FIG. 1B). Alternatively, the optical system 10 may easily utilize a MEMS mirror as reflector 50, to actively align the image on the input facet of the non-linear optical crystal 70' in the two lateral directions. The MEMS mirror may be, for example, magnetically actuated, and may tilt by about 1°.

Practical realization of folded optical configurations creates a number of challenges. First, because the folded configuration requires that the non-linear crystal 70' and the diode laser 20' to be located off lens component's the optical axis (i.e., they are decentered), off-axis optical aberrations are present and can be difficult to control. However, the optical aberrations from the folded configuration must be kept small in order to achieve high coupling efficiency between the diode laser 20' and the non-linear optical crystal 70'. One advantage of the green laser embodiment of the present invention is that off-axis aberrations are kept small, even if the lens component 30 is misaligned. In this exemplary embodiment, there are no actuators that control the focus of the optical beam by moving either the reflector 50 or the lens component 30. Advantageously, the optical system 10 of this embodiment is not sensitive to focal shifts (otherwise coupling and hence optical output power may be lost). Finally, the optical system 10 of FIG. 1B can also advantageously control or minimize optical feedback. For example, in the green laser embodiments described herein back reflections and scattering of IR light from the input facet of non-linear optical crystal 70' do not induce undesirable mode hopping behavior from the infrared diode 20'. Thus, some advantages provided by the exemplary green laser embodiments of optical system of the present invention are relatively loose angular alignment tolerances for the reflector 50 and/or the lens component 30 (on the order of 5 degrees, for example ±0.15 mm and ±3.5 degrees) and low sensitivity to the parasitic reflections occurring on the input facet of non-linear crystal.

In some laser system embodiments of the present invention, the optical path length OPL from the output facet of the diode laser 20' to the input facet of the non-linear optical crystal 70' is approximately (within ±10%) equal to an integer (n) times the optical path length inside the diode laser itself. The optical system 10 shown in FIG. 1B is designed such that the optical path length OPL between the light source 20 (the output facet of diode laser 20') and receiver 70 (input facet of SHG crystal) has about the same optical path length as the diode laser's cavity (i.e., n=1). (Please note that OPL=$D_i \times N_i$, where Di is a distance between surfaces of different components, and $N_i$ is the index of refraction of between these surfaces.) That is, the optical system 10 of FIG. 1B is designed to work in a coupled cavity condition, such that the cavity formed between the output facet of the diode laser 20' and the input facet of the non-linear optical crystal 70' has the same optical path length as that of the diode laser's cavity. Thus, for example, if the optical path lens through the diode laser crystal is 9.5 mm, then the optical path length through the optical system 10 (from the light source to the receiver) should be 9.5 mm. Thus, preferably, if the light source 20 is a diode laser, then the optical path length (OPL) from the light source to the lens component 30, through the lens component 30, and to reflector 50 is ½ of the OPL of diode laser. The advantage of this configuration is to minimize the laser wavelength instability created by the parasitic reflection off the input facet of crystal waveguide 70'A of the non-linear optical crystal 70'.

Preferably, the lens component 30 has numerical aperture NA between 0.35 and 0.6, and a focal length f of 1 mm to 3 mm, a front working distance FWD of 0.3 mm to 3 mm and a back working distance BWD of 0.5 mm to 3 mm. The FWD is the distance along the optical axis from the light source 20 to the front surface S1 of the lens component 30 (i.e., the lens surface facing the light source). The BWD is the distance from the rear surface S2 of the lens component 30 to the reflector 50. For example, BWD may be 0.8 mm, 1 mm, 1.2 mm, 1.5 mm, 1.7 mm, 2 mm, or 2.5 mm. Preferably lens component 30 is situated to image the light source at a magnification M, and $0.9 \leq |M| \leq 1.1$, more preferably $0.95 \leq |M| \leq 1.05$.

Preferably, the reflector 50 is located in the focal plane of the lens component 30 such that the direction of the average emission angle (i.e., the centroid) of the light source 20 is parallel to the average beam angle on the receiver 70 (i.e., it is parallel to the centroid of the converging light cone intercepted by the input facet of the non-linear optical crystal 70'). Preferably, if the light source 20 provides a diverging beam with a maximum half angle Θ, the reflector is located in the focal plane of the lens component 30, such that the direction of the average emission angle of the light source is parallel to the average beam angle on the receiver 70. Preferably, when a decentered light source is located in the focal plane of the lens component, and up to 750 μm off-axis, the lens component 30 is structured to provide a collimated beam such that the collimated beam is at an angle Θ' (with respect to the normal to the reflector surface) such that: $0.05 \text{ RAD} \leq \Theta' \leq 0.2 \text{ RAD}$.

The exemplary lens component 30 is structured to provide on the receiver an image of the light source, the image characterized by (i) astigmatism of more than 0.05 waves RMS, and less than 0.1 waves RMS, when the lens component is not, or not tilted with respect to the average emission angle of the light source; and (ii) astigmatism of less than 0.05 for tilt angles of 2 to 5 degrees, when the lens component is tilted by of 2 to 5 degrees with respect to the average emission angle of the light source. It is noted that at least in some embodiments the optical axis of the lens component is parallel to the average emission angle of the light source. Thus, advantageously, even if the lens component 30 is misaligned (e.g., slightly tilted or decentered) during assembly of the optical system 10, the RMS wave front error on the receiver is $\leq 0.1\lambda$ (over the lens component's NA of 0.4), where $\lambda$ is the central wavelength provided by the light source 20.

It is noted that the astigmatism may be created by: (i) wedge in the lens component, or (ii) decentration of one of the surfaces of the lens component relative to another, or (iii) by one of the surfaces being tilted relative to another.

EXAMPLES

The invention will be further clarified by the following examples.

Example 1

Figure 2:
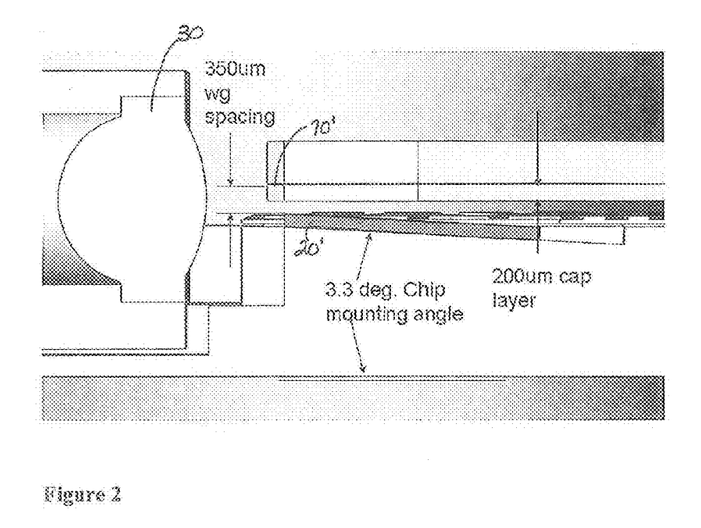
FIG. 2 is a folded cavity green laser system according to one embodiment of the present invention.
Figure 3:
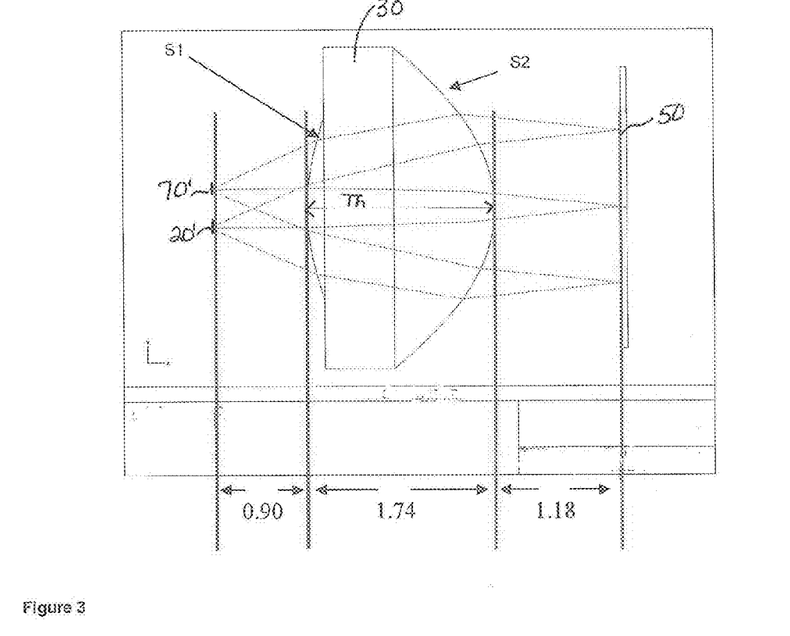
FIG. 3 is a cross-sectional view of a lens component according to one embodiment of the present invention.

FIG. 2 illustrates a portion of the exemplary folded cavity green laser system, similar to that depicted in FIG. 1B. FIG. 3 illustrates the lens component 30 shown in FIG. 2. More specifically, a non-linear optical crystal 70' (a periodically poled lithium niobate (PPLN) is placed adjacent to and over the infrared diode laser 20' in a cantilevered position. IR light is emitted from an infrared diode laser, and is captured and collimated by a lens component. The collimated infrared beam is then reflected off the reflector 50 (planar mirror, FIG. 3) and traverses back into through same lens component 30, where it gets focused onto the input facet of a waveguide in non-linear optical crystal 70'. The mirror may be a conventional fixed mirror, or it may be a mirror with actuation of its tip/tilt angle, for example a micro-electrical mechanical system (MEMS) mirror. We note that coupling of light between the diode waveguide and the crystal waveguide may be adjusted in two primary ways. First, the position of the lens component 30 may be moved in x, y, or z (focus) axis. Second, the mirror itself may be tilted. Because the mirror is located in the collimated space of the infrared beam, angular adjustments will cause position (x,y) movements of the reflected and focused beam at the input facet of the crystal. The PPLN crystal converts a substantial fraction of the infrared light into green light, which is emitted from the output facet of the crystal (not shown). Such a design allows small ($<<1 \text{ cm}^3$) laser system packages to be made that can emit greater than 50 mW of green light. Modulation at high rates (100 MHz) for scanned projection displays may be made by modulating the current input to infrared diode itself.

In this exemplary embodiment the lens component 30 of FIGS. 2 and 3 is optimized to provide RMS (root mean square) wave front error (WFE) of less than 0.1λ for a ±200 μm field at the 1060 nm wavelength, over a numerical aperture NA of 0.4, and to have a combination of the focal length and thickness such that the optical path length between the light source and the receiver is 9.36 mm.

The radii of curvature $(r_1, r_2)$, thickness T (vertex to vertex) and aspheric coefficients of the lens component 30 are selected to advantageously:

1. minimize coma and astigmatism;
2. obtain a large field of view: low field aberration combined to a large aperture (e.g., NA=0.4), such that the optical system has good coupling efficiency for separation of 400 μm (d=350 μm, ±25 μm) between the waveguide portion of diode laser 20' and the waveguide portion of non-linear optical crystal 70';
3. provide proper combination of focal length and thickness to allow the optical system 10 to work in coupled cavity condition, such that the cavity formed between the output facet of the diode laser 20' and the input facet of the non-linear optical crystal 70' (e.g., second harmonic generating (SHG) crystal) has the same optical path length as that of the diode laser cavity.

As described above, the lens component 30 has a front surface S1 and a rear surface S2. Preferably, the front surface S1 is convex and aspheric with a radius of curvature $r_1$. Preferably, the rear surface is convex and aspheric with a radius of curvature $r_2$ such that $|r_1| > |r_2|$.

The lens component 30 of FIGS. 2 and 3 has the following characteristics: (I) it allows the optical system to be in a coupled cavity condition (OPL between the diode laser and the non-linear optical crystal equals that of the diode laser within ±0.05 mm): OPL=(0.9 mm+1.744 mm×1.5+1.18 mm)×2=9.39 mm; and (II) has the following parameters: (i) FWD=0.90 mm; (ii) thickness Th (vertex to vertex) of 1.74 mm; (iii) focal length: f=1.76 mm; (iv) glass index of refraction N at 1060 nm is 1.5; (v) effective diameter of the front surface S1 is 1.4 mm; (vi) effective diameter of the rear surface S2 is 2 mm; (vi) full NA=0.61; (vii) outer diameter of the lens component is 2.5 mm to 3 mm.

The surface sag of the surfaces s1 and s2 is given by the following equation:

$$z = \frac{c \times r^2}{1 + \sqrt{1 - (1+k)c^2 \times r^2}} + \alpha 1 \times r^2 + \alpha 2 \times r^4 + \alpha 3 \times r^6 + \alpha 4 \times r^8 + \ldots$$

where c is the radius of curvature, r is the radial distance from the lens component's center and k=conic coefficient.

The surface parameters of the lens component 30 of FIGS. 2 and 3 are given in Table 1 below.

TABLE 1

| Parameters | S1 | S2 |
|---|---|---|
| radius | 1.716884 | −1.193855 |
| k | −7.316630 | −0.795432 |
| α1 | 0 | 0 |
| α2 | 0 | 0 |
| α3 | 0 | 4.107084.10−3 |
| α4 | 0 | 1.121478.10−3 |

Figure 4:
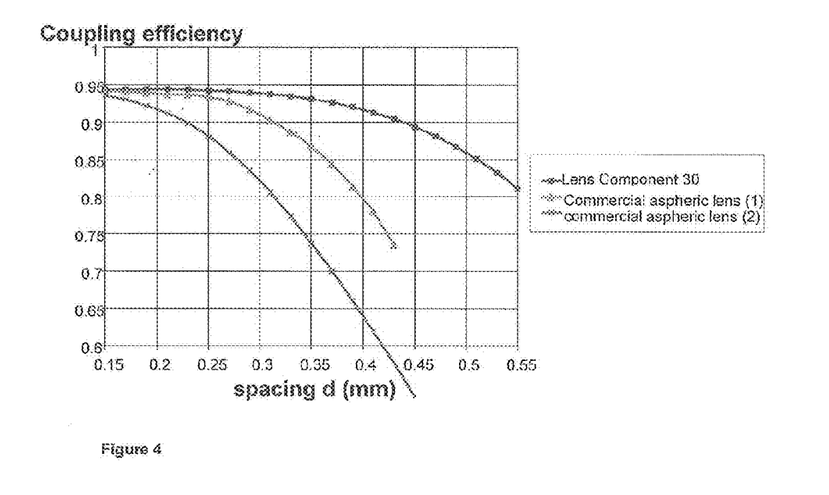
FIG. 4 illustrates coupling performance of the lens component of FIGS. 2 and 3.

FIG. 4 illustrates the performance of the lens component 30 of FIG. 2, and also the performance of two exemplary commercial aspherical lenses typically used for coupling applications. As described above, the output facet of the waveguide of the infrared diode 20' and the input facet of the waveguide of the non-linear optical crystal 70' are separated by a small distance d. FIG. 4 illustrates that the lens component 30 has a higher coupling efficiency than two commercial aspherical coupling lenses with similar focal lengths. For example, the lens component 30 maintains coupling efficiency of about 90% or higher when the output facet of the waveguide of the infrared diode 20' and the input facet of the waveguide of the non-linear optical crystal 70' are separated by the distance d of up to 450 μm (0.45 mm), while the other two lenses maintain 90% coupling efficiency for d values of only 350 μm and 215 μm respectively. Similarly, lens component 30 maintains coupling efficiency of about 80% or higher when the output facet of the waveguide of the infrared diode 20' and the input facet of the waveguide of the non-linear optical crystal 70' are separated by the distance d of about 560 μm, while the other two lenses maintain 80% coupling efficiency for d values of only about 360 μm and 270 μm respectively.

Example 2

Figure 5:
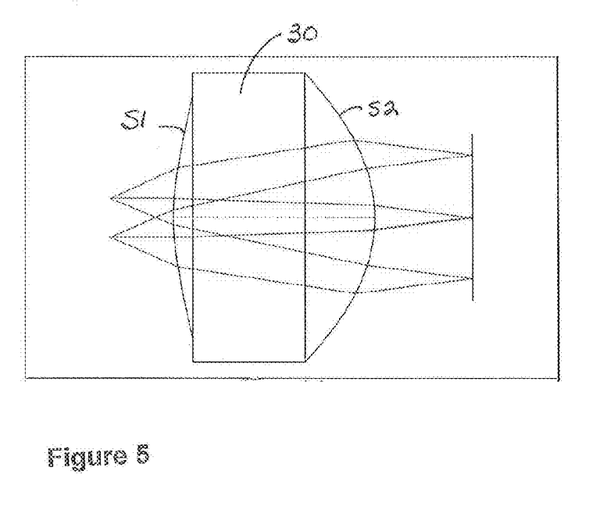
FIG. 5 is a is a cross-sectional view of a lens component according to another embodiment of the present invention.

FIG. 5 illustrates the lens component 30 suitable for use in the optical systems of FIGS. 1B and 2. The lens component 30 of FIGS. 2 and 3 has the following characteristics:
 (I) it allows the optical system to be in a coupled cavity condition (OPL between the diode laser and the non-linear optical system equals that of the diode laser within ±0.05 mm;
 (II) and has the following parameters: (i) FWD=0.568 mm; (ii) thickness Th (vertex to vertex) of 1.821 mm; (iii) focal length: f=1.4 mm; (iv) glass index of refraction N at 1060 nm is 1.78; (v) NA=0.4.

The surface parameters of the lens component 30 of FIG. 5 are given in Table 2 below.

TABLE 2

| wave length | 1060 |
|---|---|
| Lens Thickness | 1.821 |
| Refractive Index at 1060 nm | 1.783918 |

TABLE 2-continued

| Focal length | 1.400 |
|---|---|
| FWD | 0.568 |
| Diameter on MEMS (NA = 0.4) | 1130.500 |

| | R1(diode Laser side) | R2(Collimated side) |
|---|---|---|
| R | 2.09063E+00 | −1.36564E+00 |
| C | 0.47832 | −0.73226 |
| K | −15.82514 | −0.90661 |
| A4 | 0.00000E+00 | 0.00000E+00 |
| A6 | 0.00000E+00 | −2.82400E−03 |
| A8 | 0.00000E+00 | 2.45183E−03 |

Example 3

Figure 6:
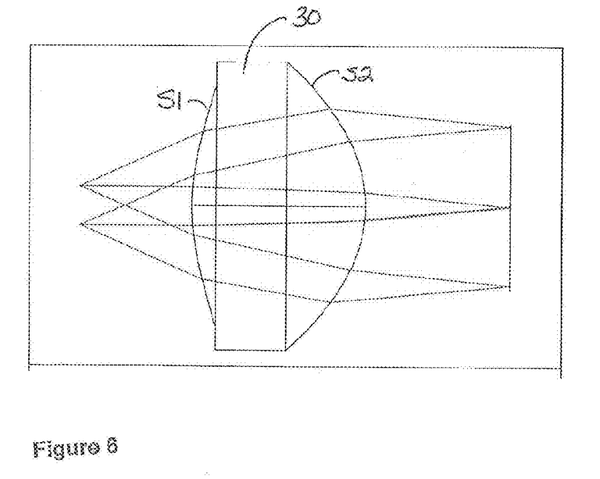
FIG. 6 is a is a cross-sectional view of a lens component according to yet another embodiment of the present invention.

FIG. 6 illustrates the lens component 30 suitable for use in the optical systems of FIGS. 1B and 2. The lens component 30 of FIGS. 2 and 3 has the following characteristics:
 (I) it allows the optical system to be in a coupled cavity condition (OPL between the diode laser and the non-linear optical system equals that of the diode laser within ±0.05 mm;
 (II) and has the following parameters: (i) FWD=1.101 mm; (ii) thickness Th (vertex to vertex) of 1.58 mm; (iii) focal length: f=1.789 mm; (iv) glass index of refraction N at 1060 nm is 1.503; (v) NA=0.4.

The surface parameters of the lens component 30 of FIG. 6 are given in Table 3 below.

TABLE 3

| wave length | 1060 |
|---|---|
| Lens Thickness | 1.578 |
| Refractive Index at 1060 nm | 1.502905 |
| Focal length | 1.789 |
| FWD | 1.014 |
| Diameter on MEMS (NA = 0.4) | 1.455 |

| | R1(diode laser side) | R2(Collimated side) |
|---|---|---|
| R | 1.88440E+00 | −1.22554E+00 |
| C | 0.53067 | −0.81596 |
| K | −8.60874 | −0.80335 |
| A4 | 0.00000E+00 | 0.00000E+00 |
| A6 | 0.00000E+00 | 2.72444E−03 |
| A8 | 0.00000E+00 | 6.31269E−04 |

Lens Component Optimization

A conventional way to optimize lens systems consists in putting all the optical components in their nominal position and let the optical design software find a local minimum for a given optimization function. Also, in order to make the positioning tolerances of the optical components as large as possible, the usual optimization method consists of minimizing the aberrations in the intermediate spaces. (i.e., between the optical components). That is, during typical optimization the lens designer try to verify that, after each optical surface that provides optical power, the wave front is as close as possible to a perfect (spherical or plane) wave front. This is usually done by including some constraints over the seidel coefficients (aberrations) in the intermediate spaces (i.e., in spaces between different surfaces and between optical elements) into the optimization function.

By applying this method to the folded configuration, we obtained excellent results with diode laser to PPLN crystal distances d of up to 0.5 mm. Unfortunately, all the designs that we obtained using this type of optimization had very tight manufacturing and assembly positioning tolerances, the most critical being probably the tilt of the lens component, which was limited to about 1 degree or less.

The impact of the slight tilt on either the lens component 30 or the mirror 50 is mostly to introduce some coma and astigmatism, both of which contribute to a coupling degradation (less efficient coupling between the diode laser and the non-linear optical crystal).

Figure 7:
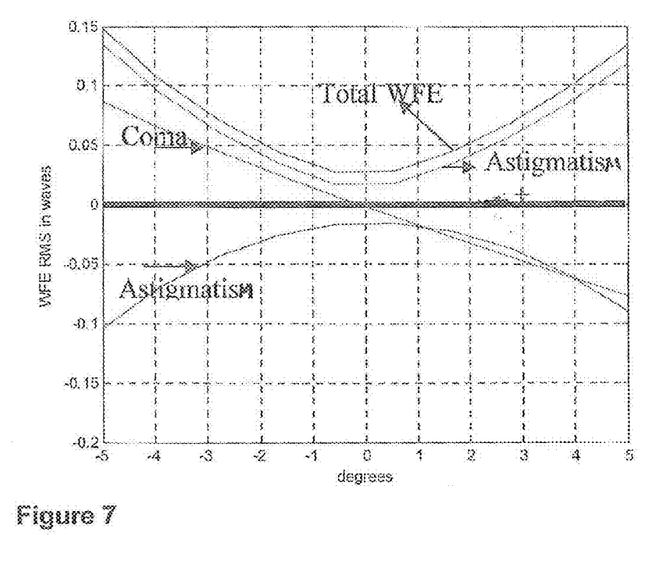
FIG. 7 illustrates the evolution of aberrations (wave front error) as a function of the tilt of an exemplary lens component.

FIG. 7 illustrates the evolution of the wave front error as a function of the tilt of the lens calculated for exemplary design of the lens component. In this configuration, the distance d between the diode laser and the PPLN crystal is kept constant (0.35 mm) and the focus is adjusted for each value of the lens tilt. As the tilt increases, amplitudes of both the coma and astigmatism (which are the predominant aberrations) increase. As a consequence, the wave front is very small when there lens component is tilted, but it rapidly degrades as the tilt increases.

Figure 8:
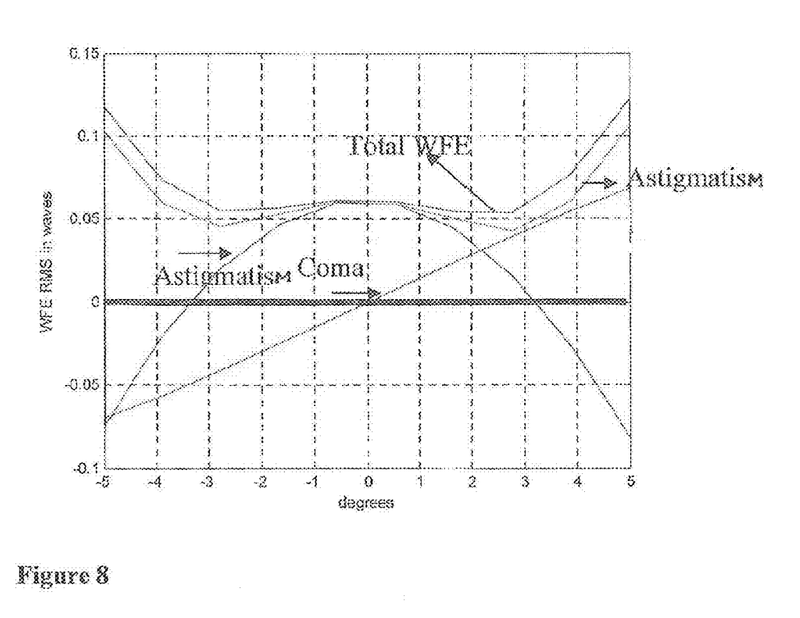
FIG. 8 illustrates the evolution of aberrations (wave front error) as a function of the tilt of an exemplary lens component.

In order to relax the tolerances, we tried another optimization method. The lens components 30 (See FIGS. 3, 5 and 6) that resulted from this optimization do not require tight tolerances. That is, tolerance analysis indicates that tolerances on lens tilt, and mirror angle, are relaxed by at least a factor of 5. In order to understand where that relaxation is coming from, we calculated again the variation of the aberrations as a function of the tilt of the lens component. As can be seen on FIG. 8, the astigmatism curve is not at a minimum when the tilt is at zero and decreases as the tilt of the lens increases. This basically means that, when all the components are at their nominal position without tilt, the design presents some residual astigmatism that compensates the one that appears when the tilt of the lens increases.

The consequence is that the total aberrations remain relatively flat over a wide range of angular tilt of the lens. In other words, the lens component 30 can advantageously accommodate a much larger range of positioning tolerances.

Figure 9:
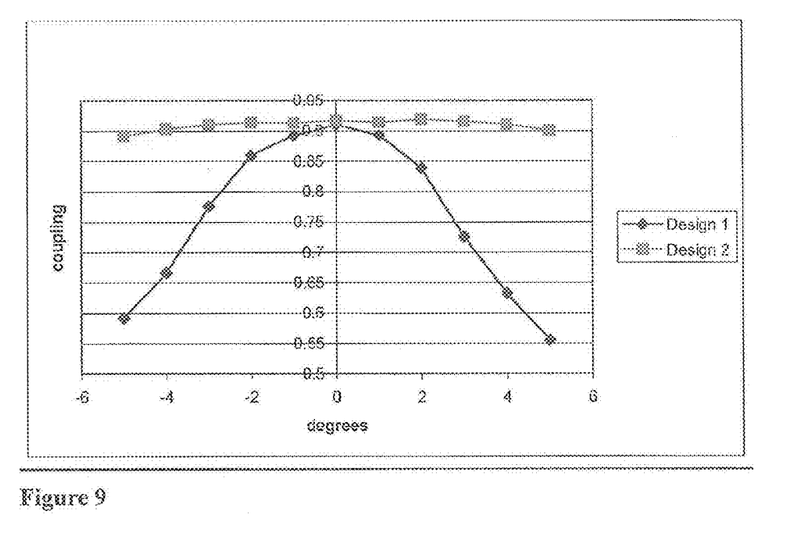
FIG. 9 is a plot of coupling efficiency as a function of the tilt of an exemplary lens component.

FIG. 9 illustrates the coupling efficiency calculated for both types of lens components (i.e., one optimized conventionally, and one with residual astigmatism) versus respectively, the tilt of the lens component and the tilt of the mirror. As can be seen, when the optical system utilizes a lens component with a small amount of astigmatism (see, for example, FIGS. 3, 5 and 6) tolerances are dramatically improved without any significant impact on the coupling.

Figure 10A:
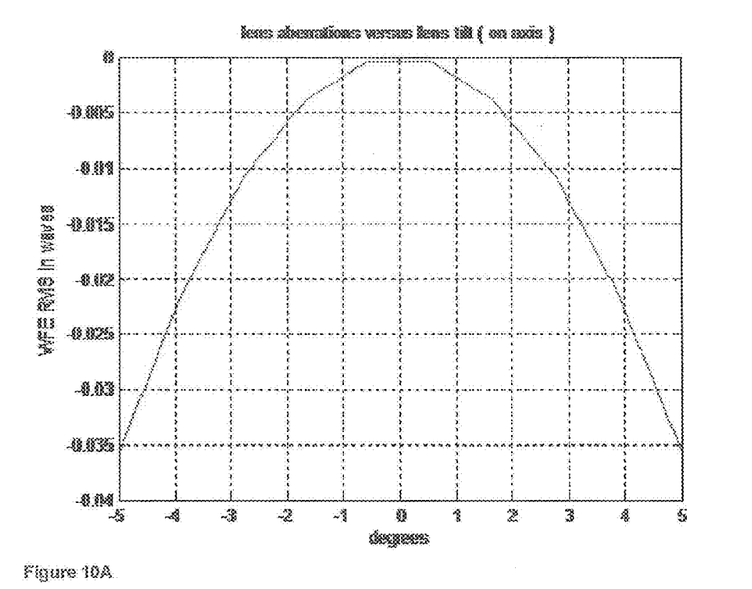
FIG. 10A illustrates astigmatism component which arises from the tilt of the lens component and its evolution with changes in tilt angles.
Figure 10B:
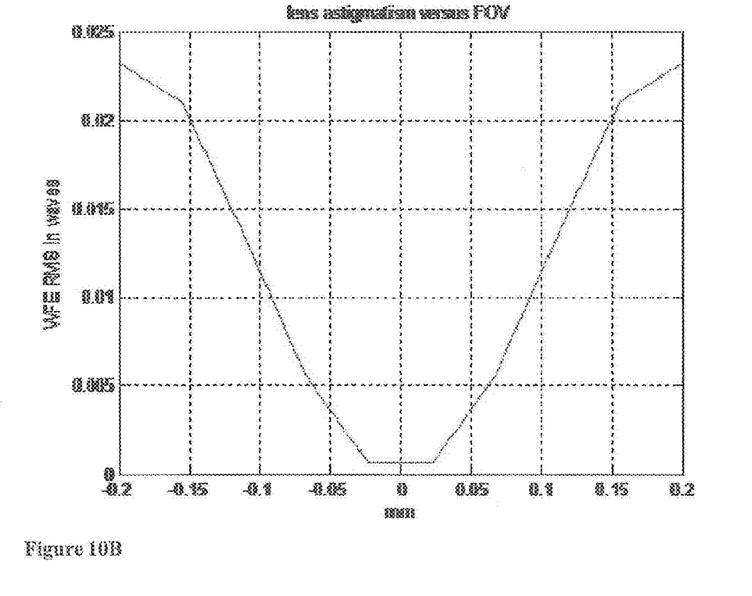
FIG. 10B illustrates the dependency of astigmatism on the field of view (FOV).

This analysis shows that positioning tolerances can be dramatically improved by introducing some residual astigmatism into the optical system design. That astigmatism compensates the one that is generated by the components' misalignments which makes the system much more forgiving to positioning tolerances. For example, wherein the image spot at the receiver has astigmatism and the astigmatism includes a field induced astigmatism component and a lens tilt induced component, the lens component 30 is preferably structured such that when one of these astigmatism components is positive, the other astigmatism component is negative, for all lens component tilt angles between 2 to 6 degrees. This is shown, for example in FIGS. 10A and 10B. More specifically, FIG. 10A illustrates an astigmatism component that is induced by the tilt of the lens component 30. FIG. 10B illustrates astigmatism component versus field of view (FOV).

It will be apparent to those skilled in the art that various modifications and variations can be made to the present invention without departing from the spirit and scope of the invention. Thus it is intended that the present invention cover the modifications and variations of this invention provided they come within the scope of the appended claims and their equivalents.

What is claimed is:

1. An optical system having an optical axis, said optical system comprising:
   (I) a light source;
   (II) a reflector; and
   (III) a lens component situated between the light source and the reflector;
   (IV) a receiver, wherein the light source and the receiver are situated substantially symmetrically and are decentred with respect to the optical axis and are separated by a distance d from one another;
   wherein: (a) the lens component is positioned to provide a collimated beam when intercepting light from the light source, and (b) the reflector is situated to intercept the collimated beam and to reflect the collimated beam to the receiver through the lens; and such that the collimated beam is at an angle $\Theta'$ to the optical axis; and (c) the lens component is structured to provide on the receiver an image of the light source, said image characterised by
      (i) astigmatism of more than 0.05 waves RMS, and less than 0.1 waves RMS, when the lens component is not misaligned with respect to the average emission angle of the light source; and
      (ii) astigmatism of less than 0.05 waves RMS for tilt angles of 2 to 5 degrees, when the lens component is tilted by 2 to 5 degrees with respect to the average emission angle of the light source.

2. The optical system according to claim 1, wherein front working distance FWD is 0.3 mm to 3 mm.

3. The optical system according to claim 1, wherein back working distance BWD is 0.5 mm to 3 mm.

4. The optical system according to claim 1, wherein said astigmatism of the lens component is not misaligned is created by: (i) wedge in the lens, or (ii) decentration of one of said surfaces relative to another, or (iii) by one of said surfaces being tilted relative to another.

5. The optical system of claim 1, wherein the light from said light source traverses the lens component twice before it reaches said receiver.

6. The optical system according to claim 1, wherein said lens is structured to provide a collimated beam such that the collimated beam is at an angle $\Theta'$ to the optical axis, wherein angle $\Theta'$ is: $0.05 \leq \Theta' \text{RAD} \leq \Theta'$ is $\leq 0.2 \text{RAD}$, when a decentered point source located in a focal plane of said lens, and up to 750 μm off-axis.

7. The optical system according claim 6, wherein said angle $\Theta'$ is: $0.09 \text{ RAD} \leq \Theta'$ is $\leq 0.17 \text{ RAD}$.

8. The optical system of claim 1 wherein said lens component is situated to image at a magnification M, and $0.9 \leq |M| \leq 1.1$.

9. The optical system according to claim 8, wherein the reflector is located in the image focal plane of the lens component, such that the direction of the average emission angle of the light source is parallel to the average beam angle on the receiver.

10. The optical system according to claim 1, said lens component having
    (a) a front surface and a rear surface, the front surface is convex and aspheric with a radius of curvature $r_1$, the rear surface is convex and aspheric with a radius of curvature $r_2$ such that $|r_1| > |r_2|$;
    (b) NA of 0.35 to 0.5; and
    (c) focal length of 1 mm to 3 mm.

11. The optical system of claim 10, wherein said light source is a diode laser, and the optical path distance OPD of lens plus the distance to said reflective surface is substantially equal (within 10%) to the optical path distance OPD of diode laser.

12. The optical system of claim 11, wherein optical path distance OPD is: less than 10 mm.

13. A lens situated on an optical axis, said lens comprising:
(I) a front surface;
(II) a rear surface separated from said front surface by a distance Th;
the lens being structured to (A) provide, when imaging an off-axis source displaced by a distance d' from the optical axis, a collimated beam exiting said rear surface, such that the collimated beam is at an angle $\Theta'$ to the optical axis; and (B) to intercept said collimated beam, when coupled with a reflective surface, and to provide an image of the off-axis source, the image having:
(a) astigmatism of more than 0.05 waves RMS, when the lens component is not misaligned with respect to average emission angle of the source; and
(b) astigmatism of less than 0.05 waves RMS for tilt angles of 2 to 6 degrees when the lens component is tilted by 2 to 6 degrees with respect to the average emission angle of the source.

14. The lens according to claim 13, wherein 25 µm$\leq$d'$\leq$750 µm and 0.05 RAD$\leq\Theta'\leq$0.2RAD.

15. The lens of claim 13, wherein the astigmatism includes a field induced astigmatism component and a lens tilt induced component, and said lens is structured such that when one of these astigmatism components is positive, the other astigmatism component is negative, for all tilt angles between 2 to 6 degrees.

16. The lens of claim 13, wherein said lens is structured such that the field induced astigmatism component is approximately equal to a negative of the lens tilt induced astigmatism for at least one tilt angle between 2 to 6 degrees.

17. The lens of claim 13, said lens having
(a) a front aspheric surface and a rear aspheric surface;
(b) NA of 0.35 to 0.5; and
(c) focal length f of 1 mm to 3 mm.

* * * * *